United States Patent
Huang et al.

(10) Patent No.: US 11,784,236 B2
(45) Date of Patent: Oct. 10, 2023

(54) METHODS FOR FORMING SEMICONDUCTOR DEVICES USING SACRIFICIAL CAPPING AND INSULATION LAYERS

(71) Applicant: NXP USA, Inc., Austin, TX (US)

(72) Inventors: Jenn Hwa Huang, Chandler, AZ (US); Yuanzheng Yue, Chandler, AZ (US); Bruce Mcrae Green, Gilbert, AZ (US); Karen Elizabeth Moore, Phoenix, AZ (US); James Allen Teplik, Mesa, AZ (US)

(73) Assignee: NXP USA, Inc., Austin, TX (US)

( * ) Notice: Subject to any disclaimer, the term of this patent is extended or adjusted under 35 U.S.C. 154(b) by 74 days.

(21) Appl. No.: 17/036,681

(22) Filed: Sep. 29, 2020

(65) Prior Publication Data
US 2022/0102529 A1   Mar. 31, 2022

(51) Int. Cl.
| | |
|---|---|
| H01L 29/66 | (2006.01) |
| H01L 21/265 | (2006.01) |
| H01L 29/778 | (2006.01) |
| H01L 29/08 | (2006.01) |
| H01L 29/20 | (2006.01) |

(52) U.S. Cl.
CPC .. *H01L 29/66462* (2013.01); *H01L 21/26553* (2013.01); *H01L 29/0843* (2013.01); *H01L 29/7786* (2013.01); *H01L 29/2003* (2013.01)

(58) Field of Classification Search
CPC ....... H01L 29/66462; H01L 29/66446–66469; H01L 29/778–7789
See application file for complete search history.

(56) References Cited

U.S. PATENT DOCUMENTS

| | | |
|---|---|---|
| 9,318,594 B2 | 4/2016 | Sheppard et al. |
| 10,957,790 B2 | 3/2021 | Green et al. |

(Continued)

FOREIGN PATENT DOCUMENTS

JP   2020088270 A   6/2020

OTHER PUBLICATIONS

Ueda, Daisuke et al; "AlGaN/GaN Devices for Future Power Switching Systems"; IEEE International Electron Devices Meeting; 4 pages (Dec. 2005).

*Primary Examiner* — Lauren R Bell

(57) ABSTRACT

Methods of fabricating a semiconductor device include providing a semiconductor substrate that includes a plurality of epitaxial layers, including a channel layer and a permanent cap over the channel layer, where the permanent cap defines an upper surface of the semiconductor substrate, and forming a sacrificial cap over the permanent cap in an active region of the device, where the sacrificial cap comprises a semiconductor material that includes aluminum. The method also includes forming one or more current carrying regions (e.g., source and drain regions) in the semiconductor substrate in the active region of the device by performing an ion implantation process to implant ions through the sacrificial cap, and into the semiconductor substrate, completely removing the sacrificial cap in the active region of the device, while refraining from removing the permanent cap, and forming one or more current carrying contacts over the one or more current carrying regions.

11 Claims, 4 Drawing Sheets

(56) References Cited

U.S. PATENT DOCUMENTS

| | | | |
|---|---|---|---|
| 2011/0092057 A1* | 4/2011 | Suvorov | H01L 29/66462 |
| | | | 257/E21.333 |
| 2017/0077830 A1* | 3/2017 | Fujii | H01L 29/66212 |
| 2017/0117402 A1* | 4/2017 | Koyama | H01L 29/7787 |
| 2019/0157440 A1* | 5/2019 | Green | H01L 29/402 |

* cited by examiner

METHODS FOR FORMING SEMICONDUCTOR DEVICES USING SACRIFICIAL CAPPING AND INSULATION LAYERS

TECHNICAL FIELD

Embodiments of the subject matter described herein relate generally to type III-N semiconductor devices, and more specifically to methods for forming gallium nitride (GaN) transistor devices.

BACKGROUND

A typical gallium nitride (GaN) transistor device (e.g., a GaN transistor) includes a base semiconductor substrate with a plurality of epitaxial layers overlying the base semiconductor substrate. Additional doped regions (e.g., source and drain regions) and structures (e.g., gate, drain, and source contacts) are formed in and over the epitaxial layers to provide the transistor functionality and electrical connectivity to the transistor.

In some devices, the source and drain contacts, which overlie the source and drain regions, respectively, may be ohmic contacts. A conventional process for forming ohmic source and drain contacts includes depositing the contact metals, and performing a high-temperature alloying process (e.g., 800 degrees Celsius or higher) in order to alloy the contact metals, and to distribute the alloyed metal over surface dislocations. This process is intended to result in low contact resistance between the source and drain contacts and the underlying source and drain regions. However, conventional ohmic contact formation processes may have significant processing issues, including issues associated with rough ohmic surfaces, ohmic metal eruption, poor contact edge definition, and so on. These issues, in turn, may result in reduced device performance (e.g., high on-resistance) and/or low manufacturing yields. Accordingly, what are needed are improved methods of forming semiconductor devices with ohmic contacts.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Embodiments of semiconductor device fabrication methods described herein address the above-described issues of ohmic contact formation in a type III-N device (e.g., a gallium nitride (GaN) device) by enabling a low-temperature, source and drain contact alloying process. More specifically, during fabrication of a semiconductor device (e.g., a GaN transistor), sacrificial cap and insulating layers are deposited over the semiconductor substrate surface prior to ion implantation associated with forming the source and drain regions. The sacrificial layers protect the surface of the semiconductor substrate, resulting in a smoother substrate surface over which the source and drain contacts may be formed. The relatively smooth surfaces enable a low temperature ohmic contact alloying process, as will be described in detail below.

Figure 1:
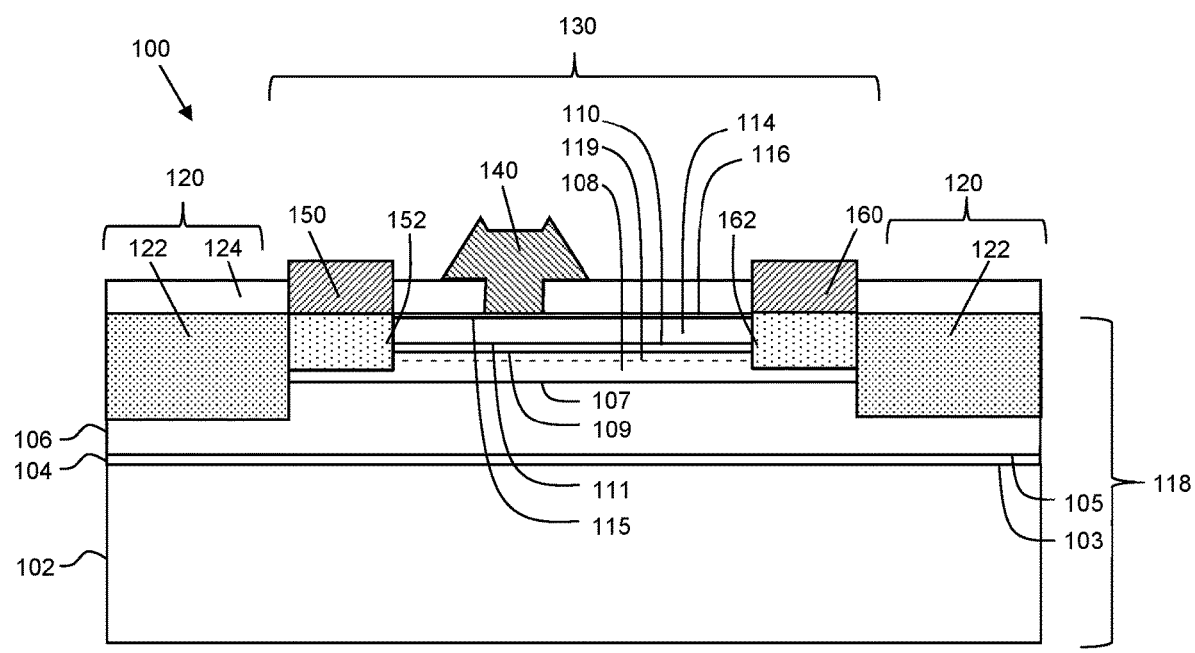
FIG. 1 is a cross-sectional, side view of a semiconductor device, in accordance with an example embodiment.

FIG. 1 is a cross-sectional, side view of a semiconductor device 100, in accordance with an example embodiment. The semiconductor device 100 includes a semiconductor substrate 118, isolation regions 120, and an active region 130 within which a high electron mobility transistor (HEMT) is formed. The transistor includes a gate electrode 140 formed over the semiconductor substrate 118, source and drain contacts 150, 160 (more generally, "first and second current carrying contacts") formed over the semiconductor substrate 118, source and drain regions 152, 162 (more generally, "first and second current carrying regions") in the semiconductor substrate 118 below the source and drain contacts 150, 160, and a channel 119 within the semiconductor substrate 118 between the source and drain regions 152, 162. The isolation regions 120 separate the active region 130 (and the transistor) from other adjacent devices (not shown) that also may be formed in and over the semiconductor substrate 118.

The semiconductor substrate 118 may include a base substrate 102, a nucleation region 104, a buffer layer 106, a channel layer 108, an optional interbarrier layer 110, a barrier layer 114, and a cap layer 116. In an embodiment, the base substrate 102 includes a silicon carbide (SiC) substrate. In other embodiments, the base substrate 102 may include other materials such as sapphire, silicon (Si), GaN, aluminum nitride (AlN), diamond, boron nitride (BN), poly-SiC, silicon on insulator, gallium arsenide (GaAs), indium phosphide (InP), and other substantially insulating or high resistivity materials.

The buffer layer 106 is formed on or over the upper surface 103 of the base substrate 102. According to an embodiment, the buffer layer 106 may include one or more group III-N semiconductor layers. More specifically, each of the one or more semiconductor layers of the buffer layer 106 may include an epitaxially grown group III-nitride epitaxial layer. The group-III nitride epitaxially layers that make up the buffer layer 106 may be nitrogen (N)-polar (i.e., N-face) or gallium (Ga)-polar (i.e., Ga-face) material, for example. In other embodiments, the semiconductor layer(s) of the buffer layer 106 may not be epitaxially grown. In still other embodiments, the semiconductor layers of the buffer layer 106 may include Si, GaAs, InP, or other suitable materials.

According to an embodiment, the buffer layer 106 may include at least one AlGaN mixed crystal layer. Each of the at least one AlGaN mixed crystal layers of the buffer layer 106 may have a composition denoted by $Al_XGa_{1-X}N$ with an aluminum mole fraction, X, that can take on values between 0 and 1. A limiting X value of 0 yields pure GaN while a value of 1 yields pure aluminum nitride (AlN). In an embodiment, the buffer layer 106 may include a nucleation region 104 comprised of AlN. In alternate embodiments, the nucleation region 104 may include a heteroepitaxial layer formed from a material selected from aluminum gallium nitride (AlGaN) or other suitable materials. The nucleation region 104 starts at the interface between the base substrate 102 and buffer layer 106, and extends upward into buffer layer 106. The buffer layer 106 may include additional $Al_XGa_{1-X}N$ layers formed over the nucleation region 104.

In an embodiment, the $Al_xGa_{1-x}N$ layer(s) may be configured as GaN (X=0) where the $Al_xGa_{1-x}N$ is not intentionally doped (NID). The $Al_xGa_{1-x}N$ layer(s) may also be configured as one or more GaN layers where the one or more GaN layers are intentionally doped with dopants that may include Si, germanium (Ge), carbon (C), iron (Fe), chromium (Cr), magnesium (Mg), or other suitable dopants that render the buffer layer 106 substantially insulating or high resistivity. The dopant concentration may be between about $10^{17}$ cm$^{-3}$ and about $10^{19}$ cm$^{-3}$ although other higher or lower concentrations may be used. In an alternate embodiment, the $Al_xGa_{1-x}N$ layer(s) may be configured with X=0.01 to 0.10 where the $Al_xGa_{1-x}N$ is NID or, alternatively, where the $Al_xGa_{1-x}N$ is intentionally doped with Fe, Cr, C, or other suitable dopant species. In other embodiments, the $Al_xGa_{1-x}N$ layers may be configured as a superlattice where the additional layers include a series of alternating NID or doped $Al_xGa_{1-x}N$ layers where the value of X takes a value between 0 and 1. In still other embodiments, the buffer layer 106 may also or alternatively include one or more indium gallium nitride (InGaN) layers, with composition denoted $In_YGa_{1-Y}N$, where Y, the indium mole fraction, may take a value between 0 and 1.

The channel layer 108 is formed on or over the upper surface 107 of the buffer layer 106. The channel layer 108 may include one or more group III-N semiconductor layers. The channel layer 108 may include an $Al_xGa_{1-x}N$ layer where X takes on values between 0 and 1. In an embodiment, the channel layer 108 is configured as GaN (X=0) although other values of X may be used. The channel layer 108 may be NID or, alternatively, may include Si, Ge, C, Fe, Cr, Mg, or other suitable dopants. The dopant concentration may be between about $10^{16}$ cm$^{-3}$ and about $10^{19}$ cm$^{-3}$ although other higher or lower concentrations may be used. In other embodiments, the channel layer may include NID or doped $In_YGa_{1-Y}N$, where Y, the indium mole fraction, may take a value between 0 and 1.

A thin interbarrier layer 110 optionally may be formed on or over the upper surface 109 of the channel layer 108, in an embodiment. The interbarrier layer 110 may be formed, for example, from AlN or another suitable material, and may introduce additional spontaneous and piezoelectric polarization, increasing the channel charge and improving the electron confinement of the below-described two dimensional electron gas (2-DEG) created within channel layer 108.

The barrier layer 114 is formed on or over the upper surface 111 of the interbarrier layer 110, when included, or directly on the upper surface 109 of the channel layer 108, when the interbarrier layer 110 is not included. The barrier layer 114 may include one or more group III-N semiconductor layers. The barrier layer 114 may have a larger bandgap and/or larger spontaneous polarization than the channel layer 108 and, when barrier layer 114 is over channel layer 108, the channel 119 may be created in the form of a 2-DEG within channel layer 108 adjacent the interface between channel layer 108 and barrier layer 114. In addition, tensile strain between barrier layer 114 and channel layer 108 may cause additional piezoelectric charge to be introduced into the 2-DEG and the channel 119.

The barrier layer 114 may include at least one NID $Al_xGa_{1-x}N$ layer where X takes on values between 0 and 1. In some embodiments, X may take a value of 0.1 to 0.35, although other values of X may be used. The barrier layer 114 may be NID or, alternatively, may include Si, Ge, C, Fe, Cr, Mg, or other suitable dopants. The dopant concentration may be between about $10^{16}$ cm$^{-3}$ and about $10^{19}$ cm$^{-3}$, although other higher or lower concentrations may be used.

In other embodiments, the barrier layer 114 may include indium aluminum nitride (InAlN) layers, denoted $In_YAl_{1-Y}N$, where Y, the indium mole fraction, may take a value between about 0.1 and about 0.2 although other values of Y may be used. In the case of using InAlN to form the barrier layer 114, the InAlN may be NID or, alternatively, may include Si, Ge, C, Fe, Cr, Mg, or other suitable dopants. The dopant concentration may be between about $10^{16}$ cm$^{-3}$ and about $10^{19}$ cm$^{-3}$ although other higher or lower concentrations may be used.

A permanent cap layer 116 may be formed on or over the upper surface 115 of the barrier layer 114. The permanent cap layer 116 presents a stable surface for the semiconductor substrate 118 and serves to protect the surface of the semiconductor substrate 118 from chemical and environmental exposure incidental to wafer processing. The permanent cap layer 116 may include one or more group III-N semiconductor layers. In an embodiment, the permanent cap layer 116 includes one or more layers of GaN. The permanent cap layer 116 may be NID or, alternatively, may include Si, Ge, C, Fe, Cr, Mg, or other suitable dopants. The dopant concentration may be between about $10^{16}$ cm$^{-3}$ and about $10^{19}$ cm$^{-3}$ although other higher or lower concentrations may be used.

Without departing from the scope of the inventive subject matter, it should be appreciated that the choice of materials and arrangement of layers to form semiconductor substrate 118 is exemplary. The inclusion of the base substrate 102, a nucleation region 104, a buffer layer 106, a channel layer 108, an optional interbarrier layer 110, a barrier layer 114, and a cap layer 116 in the semiconductor substrate 118 is exemplary, and the function and operation of the various layers may be combined and may change depending on the materials used in any specific embodiment. In other embodiments using N-polar materials (not shown), the channel layer 108 may be disposed over the barrier layer 114 to create a 2-DEG and channel directly underneath cap 116 and gate electrode 140. Still further embodiments may include semiconductor layers formed from materials including GaAs, aluminum gallium arsenide (AlGaAs), indium gallium arsenide (InGaAs), and aluminum indium arsenide (AlInAs) to form the semiconductor substrate 118.

According to an embodiment, the source and drain regions 152, 162 are formed in the semiconductor substrate 118 via an ion implantation procedure, which is described in more detail below. Essentially, the source and drain regions 152, 162 are doped with activated n- or p-type ions at a relatively high dopant concentration (e.g., about $10^{19}$ cm$^{-3}$, in some embodiments).

Before or after formation of the source and drain regions 152, 162, one or more isolation regions 120 also may be provided in the semiconductor substrate 118 to define the active region 130, according to an embodiment.

In an embodiment, a first dielectric layer 124 may be formed over the active region 130 and isolation regions 120. For example, the first dielectric layer 124 may include one of $Si_3N_4$, silicon dioxide ($SiO_2$), silicon oxynitride (SiON), $Al_2O_3$, hafnium dioxide ($HfO_2$), a combination of these, or other suitable insulating dielectric layers.

A gate electrode 140 is formed over the semiconductor substrate 118 in the active region 130. According to an embodiment, the gate electrode 140 is configured as a Schottky gate, and the gate electrode 140 is electrically coupled to the channel 119 through the cap layer 116, barrier layer 114, and interbarrier layer 110 (when included). Changes to the electric potential on the gate electrode 140 shifts the quasi Fermi level for the barrier layer 114 compared to the quasi Fermi level for the channel layer 108 and thereby modulates the electron concentration in the portion of the channel 119 underneath the gate electrode 140.

In an embodiment, a source contact 150 (generally, a "first current carrying contact") may be formed over and in contact with the semiconductor substrate 118 above the source region 152, and adjacent to one side of the gate electrode 140 in the active region 130. In an embodiment, the source contact 150 is an ohmic contact with an ohmic junction to the channel 119. The source contact 150 may be formed over and in contact with the permanent cap layer 116. In other embodiments, the source contact 150 may be recessed through the permanent cap layer 116 and may extend partially through the barrier layer 114.

In an embodiment, a drain contact 160 (generally, a "second current carrying contact") may be formed over and in contact with the semiconductor substrate 118 above the drain region 162, and adjacent to the other side of the gate electrode 140 in the active region 130. The drain contact 160 is an ohmic contact with an ohmic junction to the channel 119. In an alternate embodiment, the drain contact 160 may form a Schottky junction with the channel 109, thus acting as a Schottky diode incorporated into the drain contact 160. In an embodiment, the drain contact 160 may be formed over and in contact with the permanent cap layer 116. In other embodiments, the drain contact 160 may be recessed through the permanent cap layer 116 and extend partially through the barrier layer 114.

As will be described in more detail below, the method of forming the source and drain regions 152, 162 through sacrificial insulating and cap layers (e.g., layers 412, 410, FIG. 4) protects the surface of the substrate 118, and enables the source and drain contacts 150, 160 to be alloyed, during their formation, using a relatively low-temperature process, in comparison to temperatures used in conventional processes for forming source and drain contacts.

Figure 2:
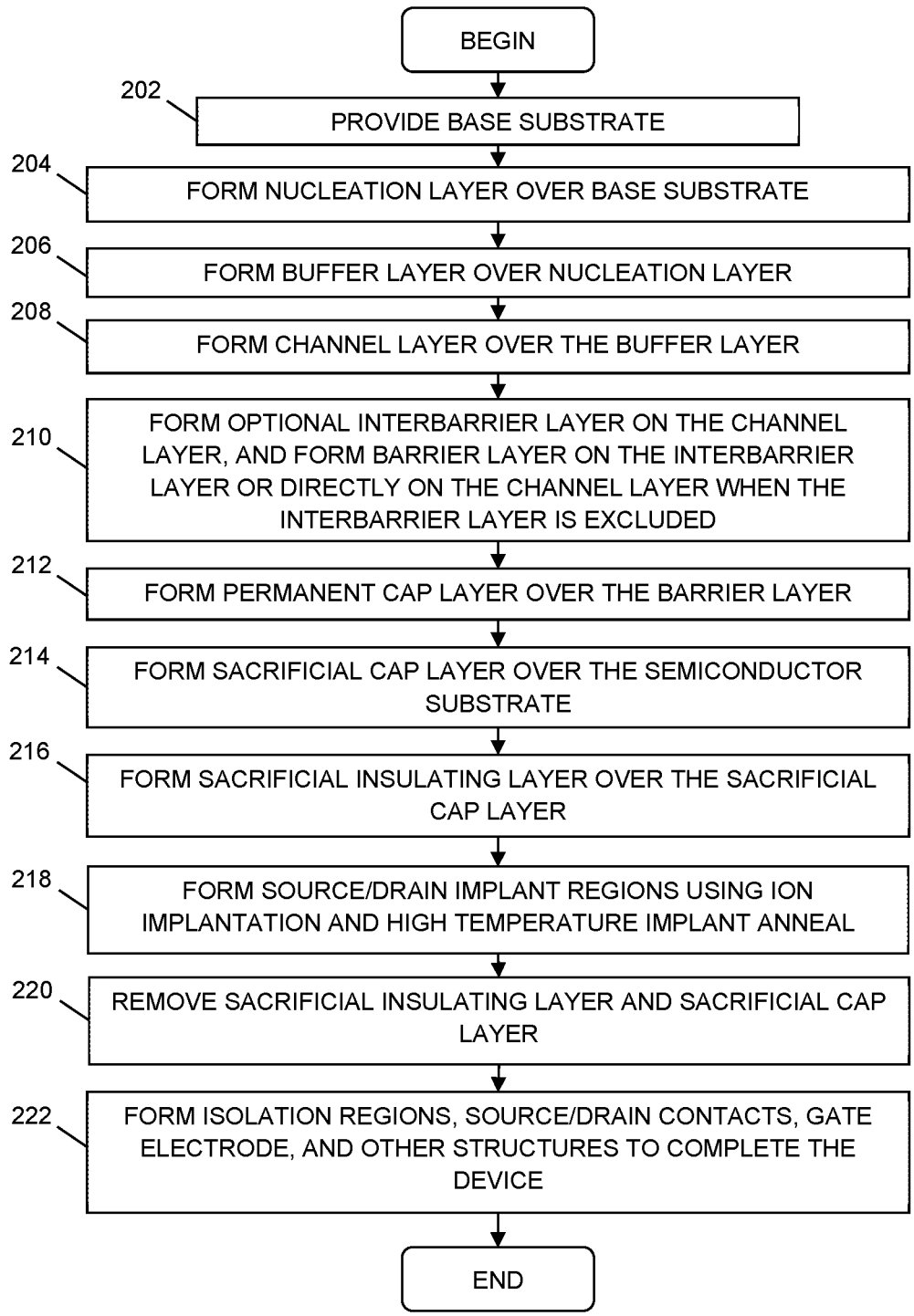
FIG. 2 is a flowchart of a method for fabricating a semiconductor device, in accordance with an example embodiment.

Example embodiments of methods for fabricating a semiconductor device (e.g., device 100) will now be described in conjunction with FIG. 2. FIG. 2 should be viewed in conjunction with FIGS. 3-6, which illustrate cross-sectional, side views of a series of fabrication steps for producing the semiconductor device of FIG. 1, in accordance with an example embodiment. It should be noted that wafer fabrication techniques would be used to create device 100, meaning that device 100 would be fabricated simultaneously with tens to hundreds of other (potentially identical) devices on a wafer, and after completion of the fabrication steps, device 100 would be singulated from the wafer. For ease of illustration, device 100 is shown in isolation from the wafer of which it would form a part.

Figure 3:
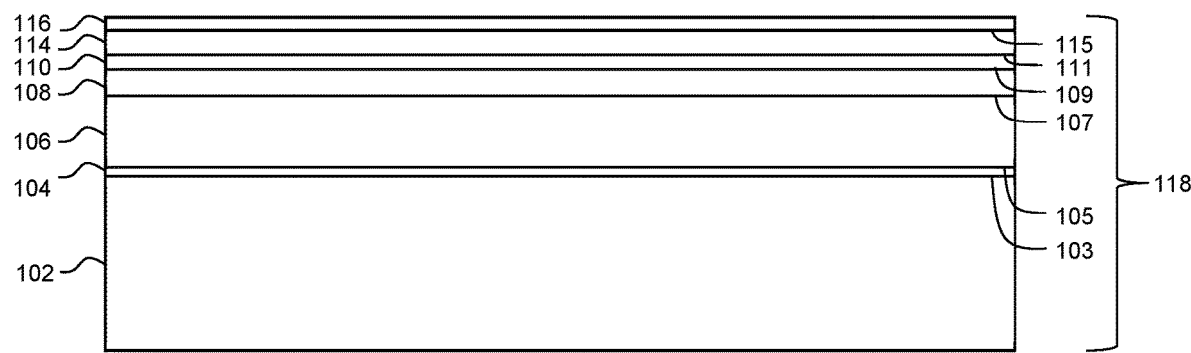
FIGS. 3-6 illustrate cross-sectional, side views of a series of intermediate fabrication steps for producing the semiconductor device of FIG. 1, in accordance with an example embodiment.

Referring both to FIG. 2 and FIG. 3, the method may begin, in block 202, by providing a base substrate 102. As discussed previously, the base substrate 102 may include SiC, or may include other materials such as sapphire, Si, GaN, AlN, diamond, poly-SiC, silicon on insulator, GaAs, InP, or other substantially insulating or high resistivity materials. The thickness (vertical dimension in FIG. 3) of the base substrate 102 may be in a range of about 100 microns to about 1000 microns although the base substrate 102 may be thinner or thicker, as well.

In block 204, a nucleation region 104 is formed on or over the upper surface 103 of the base substrate 102. As discussed previously, embodiments of the nucleation region 104 includes a heteroepitaxial layer formed from a material selected from AlN, AlGaN, or other suitable materials. The nucleation region 104 starts at the upper surface 103 of the base substrate 102 and has a thickness in a range of about 100 angstroms to about 2,000 angstroms, although the nucleation region 104 may be thinner or thicker, as well. The nucleation region 104 may be grown on or over the upper surface 103 of base substrate 102 using one of metal-organo chemical vapor deposition (MOCVD), molecular beam epitaxy (MBE), hydride-vapor phase epitaxy (HVPE) or a combination of these techniques, although other suitable techniques alternatively may be used.

In block 206, a buffer layer 106 is formed on or over the upper surface 105 of the nucleation region 104. As discussed previously, embodiments of the buffer layer 106 may include one or more group III-N semiconductor layers, including an epitaxially grown group III-nitride epitaxial layer (e.g., nitrogen (N)-face or gallium (Ga)-face materials), or alternatively may include Si, GaAs, InP, or other suitable materials. The buffer layer 106 may include at least one AlGaN mixed crystal layer. The total thickness of the buffer layer 106 may be between about 200 angstroms and about 100,000 angstroms (e.g., between about 2000 angstroms and about 20,000 angstroms), although the buffer layer 106 may be thinner or thicker, as well. The buffer layer 106 may be grown on or over the upper surface 105 of the nucleation region 104 using one of MOCVD, MBE, HVPE or a combination of these techniques, although other suitable techniques alternatively may be used.

In block 208, a channel layer 108 is formed on or over the upper surface 107 of the buffer layer 106. As discussed previously, embodiments of the channel layer 108 may include one or more group III-N semiconductor layers (e.g., including high quality NID GaN). The thickness of the channel layer 108 may be between about 50 angstroms and about 10,000 angstroms, although the channel layer 108 may be thinner or thicker, as well. The channel layer 108 may be grown on or over the upper surface 107 of the buffer layer 106 using one of MOCVD, MBE, HVPE or a combination of these techniques, although other suitable techniques alternatively may be used.

In block 210, an optional interbarrier layer 110 is formed on or over the upper surface 109 of the channel layer 108. As discussed previously, embodiments of the interbarrier layer 110 may include AlN or other suitable materials. The interbarrier layer 110 may have a thickness in a range of about 5 angstroms to about 30 angstroms, although the interbarrier layer 110 may be thinner or thicker, as well. The interbarrier layer 110 may be grown on or over the upper surface 109 of the channel layer 108 using one of MOCVD, MBE, HVPE or a combination of these techniques, although other suitable techniques alternatively may be used. In an alternate embodiment, the interbarrier layer 110 is excluded.

Also in block 210, a barrier layer 114 is formed on or over the upper surface 109 of the channel layer 108, resulting in the creation of a channel 119 in the form of a 2-DEG). When the interbarrier layer 110 is included, the barrier layer 114 is formed on the upper surface 111 of the interbarrier layer 110. When included, the interbarrier layer 110 may increase the channel charge and improve the electron confinement of the resultant 2-DEG. However, when the interbarrier layer 110 is excluded, the barrier layer 114 is formed directly on the upper surface 109 of the channel layer 108.

As discussed previously, embodiments of the barrier layer 114 may include one or more group III-N semiconductor layers (e.g., AlGaN and/or InAlN) with a relatively high percentage of Al (e.g., from about 15 percent to about 40 percent). The thickness of the barrier layer 114 may be between about 50 angstroms and about 2,000 angstroms (e.g., about 200 angstroms to about 250 angstroms), although the barrier layer 114 may be thinner or thicker, as well. The barrier layer 114 may be grown on or over the upper surface 108 of the channel layer 108 (or the upper surface 111 of the interbarrier layer 110) using one of MOCVD, MBE, HVPE or a combination of these techniques, although other suitable techniques alternatively may be used.

In block 212, a permanent cap layer 116 (also referred to herein simply as a "permanent cap") is formed on or over the upper surface 115 of the barrier layer 114. As discussed previously, embodiments of permanent cap layer 116 may include one or more group III-N semiconductor layers (e.g., GaN). The thickness of the permanent cap layer 116 may be between about 5 angstroms and about 100 angstroms (e.g., about 10 angstroms and about 50 angstroms), although the cap layer 116 may be thinner or thicker, as well. The permanent cap layer 116 may be grown on or over the upper surface 115 of the barrier layer 114 using one of MOCVD, MBE, HVPE or a combination of these techniques, although other suitable techniques alternatively may be used.

Figure 4:
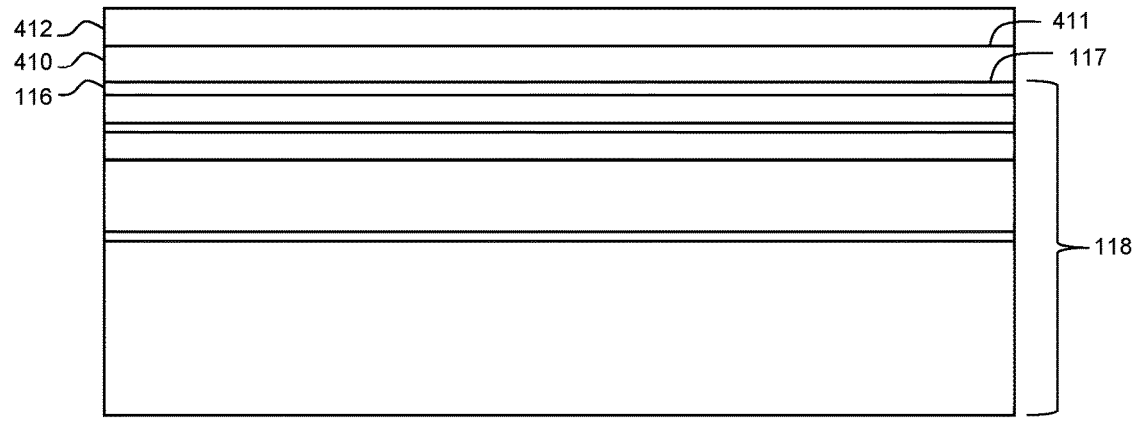

Referring both to FIG. 2 and FIG. 4, in blocks 214 and 216, and according to an embodiment, additional sacrificial layers are formed over the top surface of the semiconductor substrate 118 to protect the substrate surface during subsequently performed processes (e.g., processes performed in block 218, discussed later). More specifically, in block 214, a sacrificial cap layer 410 (also referred to herein simply as a "sacrificial cap") is formed on or over the upper surface 117 of the semiconductor substrate 118 (e.g., on or over the permanent cap layer 116). According to an embodiment, the total thickness of the sacrificial cap layer 410 may be in a range of about 100 angstroms to about 300 angstroms, although the sacrificial cap layer 410 may be thinner or thicker, as well.

According to some embodiments, the sacrificial cap layer 410 is formed as a superlattice structure that includes multiple alternating layers of AlGaN and AlN (e.g., from about 2 to about 30 layers, more or less), where each layer may have a thickness in a range of about 5 angstroms to about 100 angstroms, although each layer may be thinner or thicker, as well. In such embodiments, the sacrificial cap layer 410 may be grown on or over the upper surface 117 of the semiconductor substrate 118 (e.g., on the upper surface of the permanent cap layer 116) using one of MOCVD, MBE, HVPE or a combination of these techniques, although other suitable techniques alternatively may be used.

According to other embodiments, the sacrificial cap layer 410 is formed from AlN. For example, the sacrificial cap layer 410 may be formed from single-crystal AlN, amorphous AlN, or from multiple AlN layers (e.g., multiple single-crystal and/or amorphous AlN layers). In such embodiments, the sacrificial cap layer 410 may be grown on or over the upper surface 117 of the semiconductor substrate 118 (e.g., on the upper surface of the permanent cap layer 116) using one of MOCVD, MBE, HVPE or a combination of these techniques, although other suitable techniques alternatively may be used. For example, in some embodiments, AlN could be sputtered on the upper surface 117 of the semiconductor substrate 118. In other embodiments, amorphous AlN may be grown on the upper surface 117 of the semiconductor substrate 118 by low temperature MOCVD.

Whether it is formed from AlN or a superlattice (of AlGaN and AlN layers), the sacrificial cap layer 410 is formed from one or more materials that have a relatively high percentage of Al (e.g., about 15 percent to 100 percent Al, wherein 100 percent Al may be amorphous AlN), which makes it particularly well suited to function as an etch stop for later removing (in block 220) a subsequently formed (in block 216) sacrificial insulating layer (e.g., layer 412, FIG. 4). In addition, according to an embodiment, the sacrificial cap layer 410 functions as a strain relief layer, which may significantly reduce strain contained in the epitaxial structure of semiconductor substrate 118, especially during a subsequently performed, high temperature implant anneal process, which will be discussed below in conjunction with block 218. In addition, the sacrificial cap layer 410 may function as a diffusion barrier layer, which may prevent contaminants coming from the substrate surface or from the process environment during the implant anneal process. Even further, the sacrificial cap layer 410 may function as a good dislocation filter, serving to further filter out threading dislocations from epitaxial growth processes to present a good crystalline quality substrate surface 117 for a subsequently-formed gate electrode (e.g., gate electrode 140, FIG. 1), which will be discussed below in conjunction with block 222. Further still, the sacrificial cap layer 410 may prevent crystalline defects, such as vacancies and dislocations in the permanent cap layer 116.

In block 216, a sacrificial insulating layer 412 is formed on or over the upper surface 411 of the sacrificial cap layer 410. The sacrificial insulating layer 412 is formed from one or more dielectric materials, which in various embodiments may include $Si_3N_x$ (e.g., $Si_3N_4$), $SiO_2$, SiON, $Al_2O_3$, $HfO_2$, polycrystalline AlN, a combination thereof, or other suitable dielectric materials. The total thickness of the layers used to form sacrificial insulating layer 412 may be between about 30 angstroms and about 10,000 angstroms in thickness (e.g., about 2,000 angstroms), although the sacrificial insulating layer 412 may be thinner or thicker, as well. In some embodiments, the sacrificial insulating layer 412 may be deposited using low pressure chemical vapor deposition (LPCVD), plasma-enhanced chemical vapor deposition (PECVD), sputtering, physical vapor deposition (PVD), atomic layer deposition (ALD), catalytic chemical vapor deposition (Cat-CVD), hot-wire chemical vapor deposition (HWCVD), electron-cyclotron resonance (ECR) CVD, inductively coupled plasma (ICP) CVD, a combination of these or other suitable dielectric deposition technique(s). In other embodiments, the sacrificial insulating layer 412 may be grown on or over the upper surface 411 of the sacrificial cap layer 410 using one of MOCVD, MBE, HVPE or a combination of these techniques, although other suitable techniques alternatively may be used. In an alternate embodiment, deposition of the sacrificial insulating layer 412 may be excluded from the process.

Figure 5:
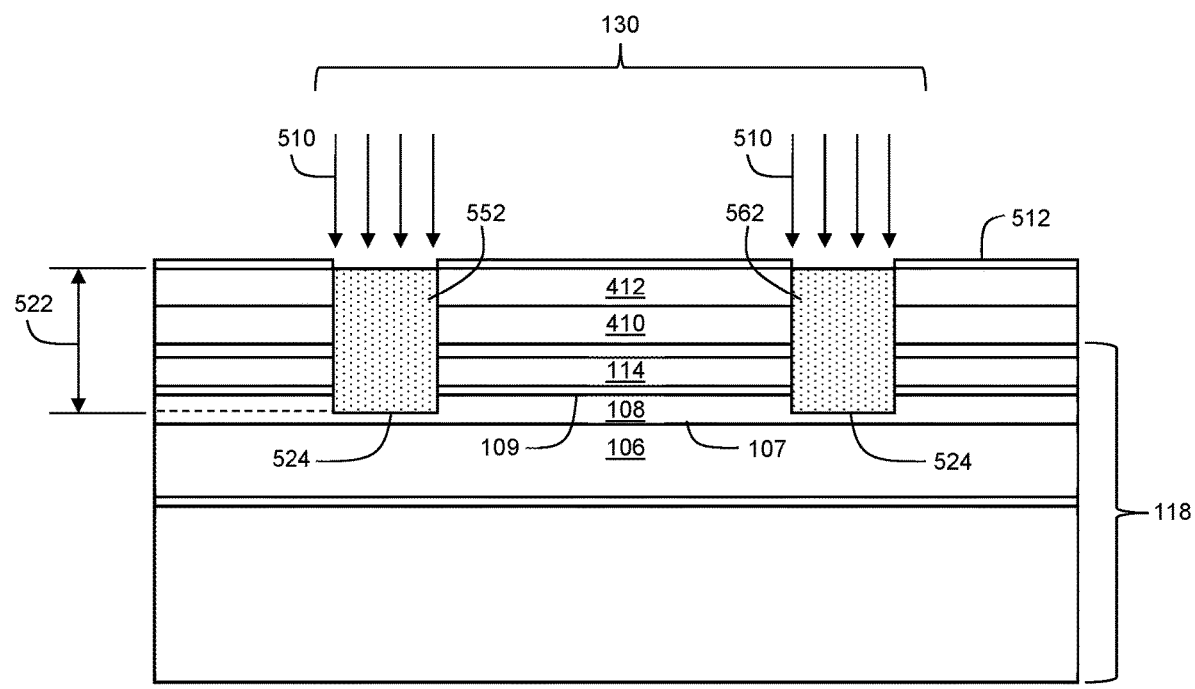

Referring both to FIG. 2 and FIG. 5, in block 218, doped source and drain regions 552, 562 are formed within the active region 130 of the device. To form the source and drain regions 552, 562, an ion implantation process is performed, followed by a high temperature implant anneal process (or dopant activation process).

The ion implantation process includes applying and patterning a mask layer 512 (e.g., photoresist) with openings over the areas at which the source and drain regions 552, 562 are to be formed. The process continues by implanting ions (indicated by arrows 510) of a suitable species through the sacrificial insulating layer 412 and the sacrificial cap layer 410, and into the semiconductor substrate 118.

In some embodiments, one or more n-type ion species are implanted to form the source and drain regions 552, 562, and these n-type ions may be selected from one or more of Si, Ge, oxygen, or other suitable ion species. In other embodiments, one or more p-type ion species are implanted to form the source and drain regions 552, 562, and these p-type ions may be selected from Mg, C, calcium (Ca), or other suitable ion species. According to an embodiment, the dopant concentration of the one or more ion species within the source and drain regions 552, 562 may be between about $10^{17}$ cm$^{-3}$ and about $10^{21}$ cm$^{-3}$ (e.g., about $10^{19}$ cm$^{-3}$), although other higher or lower concentrations may be used.

The implant energy and acceleration voltage used to implant the ions are sufficient to ensure substantial penetration of the ions through the various layers to a desired depth 522. For example, the acceleration voltage used to implant the ions may be in a range of about 50 kilovolts to about 200 kilovolts, although lower or higher acceleration voltages alternatively may be used.

For example, the implant energy and acceleration voltage may be selected to implant the ions through the sacrificial insulating layer 412 and the sacrificial cap layer 410, and into the permanent cap layer 116, and the barrier layer 114. In some embodiments, the bottom boundaries 524 of the implanted source and drain regions 552, 562 may be between the top and bottom surfaces of the barrier layer 114, or substantially at the bottom surface of the barrier layer 114. In other embodiments, the implant energy and acceleration voltage may be selected to implant the ions through the sacrificial insulating layer 412 and the sacrificial cap layer 410, and into the permanent cap layer 116, the barrier layer 114, the interbarrier layer 110 (if included), and at least partially through the channel layer 108, which results in the bottom boundaries 524 of the implanted source and drain regions 552, 562 being located below the upper surface 109 of the channel layer 108. In some embodiments, the ions may be implanted partially through the channel layer 108, and in other embodiments, the ions may be implanted entirely through the channel layer 108, so that the bottom boundaries 524 are below the upper surface 107 of the buffer layer 106.

Upon completion of the ion implantation process, the mask layer 512 may be removed, and a high temperature implant anneal (i.e., dopant activation) process is performed. Essentially, the implant anneal process integrates the implanted ions into a reorganized crystal lattice so that the implanted ions perform as an active dopant (i.e., the ions are activated so that the carriers may conduct current). The implant anneal process may cause the implanted ions to diffuse slightly, although diffusion in GaN may be limited. According to an embodiment, the implant anneal process includes exposing the partially-completed device, for a period of time, to an extremely high temperature. For example, the implant anneal temperature may be in a range of about 1000 degrees Celsius to about 1300 degrees Celsius (e.g., about 1100 degrees Celsius), although the temperature may be lower or higher, as well. The device may be subjected to the implant anneal temperature for a period of time in a range of 5 minutes to 20 minutes, although the anneal period of time may be shorter or longer, as well.

Figure 6:
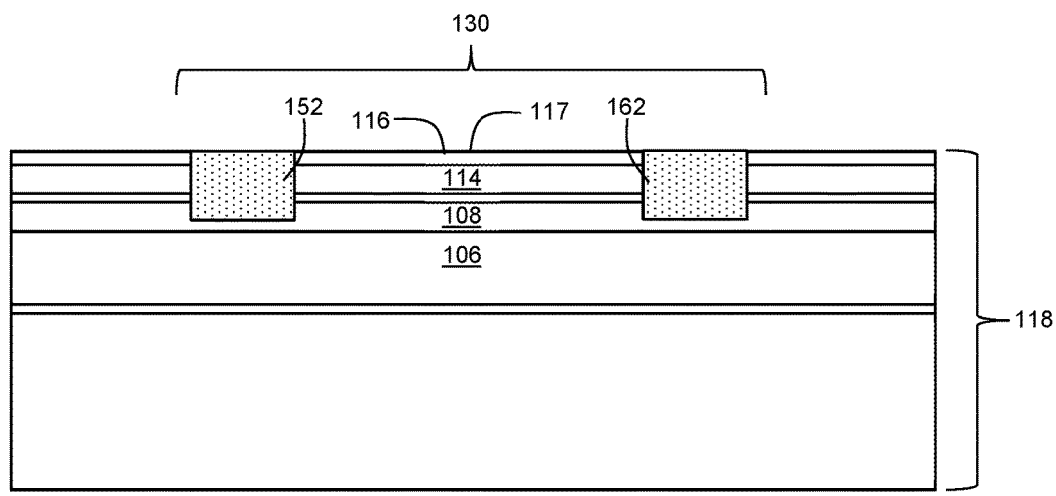

Referring both to FIG. 2 and FIG. 6, in block 220, after the high temperature implant anneal process, the sacrificial insulating layer 412 is removed, followed by complete removal of the sacrificial cap layer 410 at least in the active region 130, and desirably across the entire surface of the partially completed device. These removal processes result in exposure of the upper surface 117 of the permanent cap layer 116. The layer removal processes also removes portions of the doped regions 552, 562, resulting in doped source and drain regions 152, 162 with top surfaces that are substantially co-planar with the upper surface 117 of the semiconductor substrate 118 (e.g. the upper surface of permanent cap layer 116) and the semiconductor substrate 118.

The sacrificial insulating layer 412 may be removed, for example, using a dry etch process. Desirably, the composition of the sacrificial cap layer 410 is selected to act as an etch stop for the dry etch process used to remove the sacrificial insulating layer 412.

The process used to remove the sacrificial cap layer 410 is dependent on the material from which the sacrificial cap layer 410 is formed. For example, in an embodiment in which the sacrificial cap layer 410 comprises a superlattice structure (e.g., an AlGaN/AlN superlattice structure), the sacrificial cap layer 410 may be removed using a selective dry etch process. Conversely, in an embodiment in which the sacrificial cap layer 410 comprises AlN, the sacrificial cap layer 410 may be removed using a wet etch process (e.g., using a sodium- or potassium-based inorganic developer, a potassium hydroxide (KOH) solution, or another suitable wet etch solution).

Referring both to FIG. 2 and again to FIG. 1, in block 222, additional processes for completing the semiconductor device 100 are performed. These additional processes may include forming isolation regions 120 outside the boundaries of the active region 130. The isolation regions 120 may be formed via an implantation procedure configured to damage the epitaxial layers to create high resistivity regions 122 of the semiconductor substrate 118. In other words, the semiconductor substrate 118 is rendered high resistivity or semi-insulating in those high resistivity regions 122 while the crystal structure in the active region 130 is left intact. For example, isolation regions 120 may be formed by implanting an ion species at an energy sufficient to drive the species through cap layer 116, barrier layer 114, interbarrier layer 110 (when included), and channel layer 108, and into buffer layer 106 thus damaging the crystal lattice for these layers, disrupting the channel 119 within the isolation regions 120, and creating high resistivity regions 122 within semiconductor substrate 118. In other embodiments, the isolation regions 120 may be formed by removing portions of the epitaxial semiconductor layers of the semiconductor substrate 118 within the isolation regions 120, and leaving behind active region 130 "mesas" surrounded by high resistivity or semi-insulating isolation regions 120.

To further process the device 100, a first dielectric layer 124 is formed over at least the active region 130. As mentioned previously, the first dielectric layer 124 may include $Si_3N_4$, $SiO_2$, SiON, $Al_2O_3$, $HfO_2$, a combination of these, or other suitable insulating dielectric layers.

A gate electrode 140 is then formed in the active region 130. In an embodiment, to form the gate electrode 140, an opening is made in the first dielectric layer 124 to expose a portion of the upper surface 117 of the semiconductor substrate 118 (e.g. the upper surface of the permanent cap layer 116). The gate electrode 140 may be configured as a Schottky gate, for example, and may be formed over and directly in contact with the permanent cap layer 116 using a Schottky material layer and a conductive metal. More specifically, the Schottky material layer may be applied to the upper surface 117 of the semiconductor substrate 118 (e.g. the upper surface of permanent cap layer 116), and a conductive low stress metal may be deposited over the Schottky material layer to form gate electrode 140, in an embodiment. The gate electrode 140 may be T-shaped with a vertical stem, as shown, or may be a square shape in other embodiments. In other embodiments, the gate electrode 140 may be recessed through the permanent cap layer 116 and extend partially into the barrier layer 114, increasing the electrical coupling of the gate electrode 140 to the channel 119 through the barrier layer 114. In other embodiments, the gate electrode 140 may be formed over a gate dielectric or gate oxide forming a metal-insulator-semiconductor (MIS) junction or metal oxide semiconductor (MOS) junction, electrically coupling to the channel 119 through the dielectric or oxide layer.

The source and drain contacts 150, 160 are formed in the active region 130 over the source and drain regions 152, 162, respectively, and on opposite sides of the gate electrode 140. To form the source and drain contacts 150, 160, openings are made in the first dielectric layer 124 to expose portions of the permanent cap layer that correspond to upper surfaces of the source and drain regions 152, 162. The source and drain contacts 150, 160 may both be configured as ohmic contacts, for example, and may be formed over and directly in contact with the source and drain regions 152, 162. To form the source and drain contacts 150, 160, a plurality of conductive layers may be applied sequentially to and over the upper surfaces of the source and drain regions 152, 162. For example, to form the contacts 150, 160, a titanium layer (e.g., about 100-300 angstroms thick) first may be deposited on the upper surfaces of the source and drain regions 152, 162, followed by an aluminum layer (e.g., about 400-1200 angstroms thick), and followed by a layer of a refractory barrier metal (e.g., about 400-500 angstroms thick) selected from nickel, tungsten, and/or other suitable materials. In some embodiments, a gold layer (e.g., about 400-500 angstroms thick) may be deposited as the highest conductive layer of the contact 150, 160. In other embodiments, more, fewer, or different conductive material layers may be used to form the source and drain contacts 150, 160.

After depositing the various material layers comprising the source and drain contacts 150, 160, an alloying process is performed on the metal layers that may distribute the alloyed metal along defects such as threading dislocations in the semiconductor substrate and cause metallic "spiking" or "dendrites" to form along the dislocations and other crystal defects. The spiking or dendrites may result in low contact resistance between the contacts 150, 160 and the source and drain regions 162. Using conventional processes, source and drain contacts may be alloyed at a relatively high temperature (e.g., 800 degrees Celsius or higher) to enable the contact materials to diffuse along the dislocations in the crystalline material of the semiconductor substrate. However, the above-described processes used to form the source and drain regions 150, 160 result in the source and drain regions 152, 162 having smoother surfaces (i.e., reduced surface roughness) than is possible using conventional techniques. This enables a low-temperature alloying process to be used, according to an embodiment. For example, the alloying process may include exposing the device, for a period of time, to a relatively-low temperature in a range of about 200 degrees Celsius to about 500 degrees Celsius, although the temperature may be lower or higher, as well. To complete formation of the source and drain contacts, the device may be subjected to the alloying temperature for a period of time in a range of 1 minute to 20 minutes, although the period of time to alloy the contacts 150, 160 may be shorter or longer, as well.

At this point, it can be noted that, because the sacrificial cap layer 410 was completely removed in block 220, in the completed device 100, no portion of the sacrificial cap layer 410 remains under the gate electrode 140 or under the source and drain contacts 150, 160, in an embodiment.

After formation of the gate electrode 140 and the source and drain contacts 150, 160, metal electrodes (not shown) may be formed on or over the source and drain contacts 150, 160 in the active region 130. In addition, one or more additional dielectric layers (not shown) may be formed over the metal electrodes, the gate electrode 140, the source and drain contacts 150, 160, and the first dielectric layer 124 in the isolation regions 120 and the active region 130. The additional dielectric layer(s) encapsulate the active region 130 and the isolation regions 120, protecting the surface from moisture and other contaminants. Additional metal electrodes, dielectric layers, and patterned metal layers also may be formed to provide desired electrical connectivity to the transistor device within the active region 130. Upon completion of the process to form device 100, the device 100 may be singulated from the wafer of which it formed a part, and the method ends.

An embodiment of a method of fabricating a semiconductor device includes providing a semiconductor substrate that includes a plurality of epitaxial layers, including a channel layer and a permanent cap over the channel layer, where the permanent cap defines an upper surface of the semiconductor substrate, and forming a sacrificial cap over the permanent cap in an active region of the device, where the sacrificial cap comprises a semiconductor material that includes aluminum (Al). The method also includes forming one or more current carrying regions in the semiconductor substrate in the active region of the device by performing an ion implantation process to implant ions through the sacrificial cap, and into the semiconductor substrate, completely removing the sacrificial cap in the active region of the device, while refraining from removing the permanent cap, and forming one or more current carrying contacts over the one or more current carrying regions.

In a further embodiment, forming the sacrificial cap includes forming a superlattice structure that includes multiple alternating layers of aluminum gallium nitride (AlGaN) and aluminum nitride (AlN). In another further embodiment, forming the sacrificial cap includes forming one or more layers of aluminum nitride (AlN) (e.g., one or more amorphous layers of AlN or Al). In yet another further embodiment, the sacrificial cap is formed from one or more materials with a percentage of aluminum in a range from 15 percent to 100 percent. In yet another further embodiment, the semiconductor material in the sacrificial cap includes a group-III nitride semiconductor material that includes aluminum. In yet another further embodiment, after forming the sacrificial cap, the method includes forming a sacrificial insulating layer over the sacrificial cap in the active region of the device, and prior to completely removing the sacrificial cap, removing the sacrificial insulating layer, where performing the ion implantation process includes implanting ions through the sacrificial insulating layer and the sacrificial cap. In yet another further embodiment, the one or more current carrying regions include a source region and a drain region, and performing the ion implantation process includes applying a patterned mask layer over the sacrificial cap layer, where the patterned mask layer includes openings over areas at which the source and drain regions are to be formed, implanting ions through the sacrificial cap, and into the permanent cap and the barrier layer to achieve a dopant concentration in the source and drain regions in a range of $10^{17}$ cm$^{-3}$ to $10^{20}$ cm$^{-3}$, and performing an implant anneal process at a temperature of at least 1000 degrees Celsius.

Another embodiment of a method of fabricating a semiconductor device includes providing a semiconductor substrate that includes a base substrate and a plurality of epitaxial layers over the base substrate, where the plurality of epitaxial layers include a channel layer, a barrier layer over the channel layer, and a permanent cap over the barrier layer, where the channel layer includes one or more layers of aluminum gallium nitride ($Al_XGa_{1-X}N$), wherein X takes on values between 0 and 1, where the barrier layer includes one or more layers of $Al_XGa_{1-X}N$, where the permanent cap is formed from one or more layers of gallium nitride (GaN), and where the permanent cap defines an upper surface of the semiconductor substrate. The method further includes forming a sacrificial cap over the permanent cap in an active region of the device, where the sacrificial cap is selected from a structure consisting of an aluminum nitride (AlN) layer and a superlattice comprising AlGaN and AlN layers, and forming a sacrificial insulating layer over the sacrificial cap in the active region of the device. The method further includes forming a source region and a drain region in the semiconductor substrate in the active region of the device by performing an ion implantation process to implant ions through the sacrificial insulating layer and the sacrificial cap, and into the barrier layer, completely removing the sacrificial insulating layer and the sacrificial cap in the active region of the device, while refraining from removing the permanent cap, forming a source contact over the source region, and forming a drain contact over the drain region.

An embodiment of a partially-completed semiconductor device includes a semiconductor substrate that includes a base substrate and a plurality of epitaxial layers over the base substrate, where the plurality of epitaxial layers include a channel layer, a barrier layer over the channel layer, and a permanent cap over the barrier layer, where the channel layer includes one or more layers of aluminum gallium nitride ($Al_XGa_{1-X}N$), where X takes on values between 0 and 1, where the barrier layer includes one or more layers of $Al_XGa_{1-X}N$, where the permanent cap is formed from one or more layers of gallium nitride (GaN), and where the permanent cap defines an upper surface of the semiconductor substrate. The partially-completed device also includes a sacrificial cap over the permanent cap in an active region of the device, where the sacrificial cap is selected from a semiconductor material that includes aluminum (Al), a structure consisting of an aluminum nitride (AlN) layer, and a superlattice comprising AlGaN and AlN layers. The partially-completed device also includes a source region and a drain region in the semiconductor substrate in the active region of the device, where the source region and the drain region are formed from ions implanted through the sacrificial cap, and into the barrier layer.

Although the illustrated and above-described semiconductor device has a particular HEMT structure, those of skill in the art would understand, based on the description herein, that various modifications may be made to produce differently configured structures that include the inventive subject matter. For example, a HEMT device may include more and/or different semiconductor layers and/or other electrically-active or electrically-inactive structures. In addition, although the above-described device embodiments pertain to a HEMT device with a channel in the form of a 2-DEG, an enhanced resistivity region may be incorporated into a HEMT device with a channel in the form of a two dimensional hole gas (2-DHG) near the interface between the channel and barrier layers, in other embodiments. In still other embodiments, the processes described above may be implemented to fabricate a device other than a HEMT device, including but not limited to metal semiconductor field effect transistors (MESFET's) and metal-oxide semiconductor field effect transistors (MOSFET's).

The foregoing detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the foregoing detailed description.

For the sake of brevity, conventional semiconductor fabrication techniques may not be described in detail herein. In addition, certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of fabricating a semiconductor device, the method comprising the steps of:
    providing a semiconductor substrate that includes a plurality of epitaxial layers, including a channel layer and a permanent cap over the channel layer, wherein the permanent cap defines an upper surface of the semiconductor substrate;
    forming a sacrificial cap over the permanent cap in an active region of the device, wherein the sacrificial cap comprises a semiconductor material that includes a superlattice structure with multiple pairs of alternating layers of aluminum gallium nitride (AlGaN) and aluminum nitride (AlN), and wherein a composition of the sacrificial cap is selected to act as an etch stop during subsequent removal of a sacrificial insulating layer;
    after forming the sacrificial cap, forming the sacrificial insulating layer over the sacrificial cap in the active region of the device;
    forming one or more current carrying regions in the semiconductor substrate in the active region of the device by performing an ion implantation process to implant ions through the sacrificial insulating layer and the sacrificial cap, and into the semiconductor substrate;

removing the sacrificial insulating layer using a first etch process that stops at the sacrificial cap, wherein the first etch process is a dry etch process;

after removing the sacrificial insulating layer, using a second etch process to completely remove the sacrificial cap in the active region of the device, while refraining from removing the permanent cap; and forming one or more current carrying contacts over the one or more current carrying regions.

2. The method of claim 1, wherein the channel layer and the permanent cap include gallium nitride.

3. The method of claim 1, wherein the permanent cap comprises a not intentionally doped gallium nitride layer.

4. The method of claim 1, wherein forming the sacrificial insulating layer comprises:

forming a layer from one or more dielectric materials selected from a group consisting of $Si_3N_x$, $SiO_2$, SiON, $Al_2O_3$, $HfO_2$, polycrystalline AlN, and a combination thereof.

5. The method of claim 1, wherein the one or more current carrying regions comprise a source region and a drain region, and wherein:

the method further comprises, after forming the sacrificial cap, applying a patterned mask layer over the sacrificial cap, wherein the patterned mask layer includes openings over areas at which the source and drain regions are to be formed;

performing the ion implantation process by implanting ions through the openings in the patterned mask layer and through the sacrificial cap, and into the permanent cap and the barrier layer to achieve a dopant concentration in the source and drain regions in a range of $10^{17}$ $cm^{-3}$ to $10^{20}$ $cm^{-3}$; and the method further comprises, after performing the ion implantation process, performing an implant anneal process at a temperature of at least 1000 degrees Celsius.

6. The method of claim 5, wherein the one or more current carrying contacts comprise a source contact and a drain contact, the source contact and the drain contact are ohmic contacts, and wherein forming the one or more current carrying contacts comprises:

forming a dielectric layer over the active region with openings that expose portions of the permanent cap that correspond to upper surfaces of the source region and the drain region;

forming a plurality of conductive layers over the portions of the permanent cap that correspond to the upper surfaces of the source region and the drain region; and performing an alloying process at a temperature of 400 degrees Celsius or less to complete the source contact and the drain contact.

7. The method of claim 1, further comprising:

forming a gate electrode over the permanent cap between the one or more current carrying regions.

8. A method of fabricating a semiconductor device, the method comprising the steps of:

providing a semiconductor substrate that includes a base substrate and a plurality of epitaxial layers over the base substrate, wherein the plurality of epitaxial layers include a channel layer, a barrier layer over the channel layer, and a permanent cap over the barrier layer, wherein the channel layer includes a layer of aluminum gallium nitride ($Al_xGa_{1-x}N$), wherein X takes on a first value between 0 and 1, wherein the barrier layer includes one or more additional layers of $Al_xGa_{1-x}N$, wherein X takes on a second value between 0 and 1 that may be the same or different from the first value, wherein the permanent cap is formed from one or more layers of gallium nitride (GaN), and wherein the permanent cap defines an upper surface of the semiconductor substrate;

forming a sacrificial cap over the permanent cap in an active region of the device, wherein the sacrificial cap is a superlattice comprising multiple pairs of alternating AlGaN and aluminum nitride (AlN) layers, and wherein a composition of the sacrificial cap is selected to act as an etch stop during subsequent removal of a sacrificial insulating layer;

forming the sacrificial insulating layer over the sacrificial cap in the active region of the device;

forming a source region and a drain region in the semiconductor substrate in the active region of the device by performing an ion implantation process to implant ions through the sacrificial insulating layer and the sacrificial cap, and into the barrier layer;

removing the sacrificial insulating layer using a first etch process that stops at the sacrificial cap, wherein the first etch process is a dry etch process;

after removing the sacrificial insulating layer, completely removing the sacrificial cap in the active region of the device using a second etch process, while refraining from removing the permanent cap;

forming a source contact over the source region; and forming a drain contact over the drain region.

9. The method of claim 8, wherein performing the ion implantation process comprises:

applying a patterned mask layer over the sacrificial insulating layer, wherein the patterned mask layer includes openings over areas at which the source and drain regions are to be formed;

implanting ions through the sacrificial insulating layer and the sacrificial cap, and into the permanent cap and the barrier layer to achieve a dopant concentration in the source and drain regions in a range of $10^{17}$ $cm^{-3}$ to $10^{20}$ $cm^{-3}$; and performing an implant anneal process at a temperature of at least 1000 degrees Celsius.

10. The method of claim 8, wherein the source contact and the drain contact are ohmic contacts, and wherein forming the source contact and forming the drain contact comprises:

forming a dielectric layer over the active region with openings that expose portions of the permanent cap that correspond to upper surfaces of the source region and the drain region;

forming a plurality of conductive layers over the portions of the permanent cap that correspond to the upper surfaces of the source region and the drain region; and performing an alloying process at a temperature of 400 degrees Celsius or less to complete the source contact and the drain contact.

11. The method of claim 8, wherein the base substrate comprises a material selected from silicon carbide, sapphire, silicon, gallium nitride, aluminum nitride, diamond, poly-SiC, silicon on insulator, gallium arsenide, and indium phosphide.

* * * * *